United States Patent
Kanamori

[11] Patent Number: 6,147,370
[45] Date of Patent: *Nov. 14, 2000

[54] FIELD EFFECT TRANSISTOR WITH FIRST AND SECOND DRAIN ELECTRODES

[75] Inventor: Mikio Kanamori, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/933,836

[22] Filed: Sep. 19, 1997

[30] Foreign Application Priority Data

Sep. 20, 1996 [JP] Japan ................................ 8-250169

[51] Int. Cl.$^7$ .................. H01L 31/072; H01L 31/109; H01L 31/0328; H01L 31/0336
[52] U.S. Cl. .................. 257/192; 257/194; 257/195; 257/283; 438/167; 438/172
[58] Field of Search .................. 257/192, 194, 257/195, 283; 438/167, 172

[56] References Cited

U.S. PATENT DOCUMENTS

| | | |
|---|---|---|
| 4,636,823 | 1/1987 | Margalit et al. .................. 357/23.3 |
| 5,060,030 | 10/1991 | Hoke .................. 357/22 |
| 5,140,386 | 8/1992 | Huang et al. .................. 357/22 |

FOREIGN PATENT DOCUMENTS 4-237136  8/1992  Japan.

OTHER PUBLICATIONS

R. Yamamoto, et al., "Light Emission and Burnout Characteristics of GaAs Power MESFET's", IEEE Transactions of Electron Devices, vol. ED–25, No. 6, Jun. 1978, pp. 567–573.

English language translation of Japanese Office Action dated Jul. 28, Hei 10.

*Primary Examiner*—William Mintel
*Attorney, Agent, or Firm*—McGuireWoods LLP

[57] ABSTRACT

To enhance a drain current voltage characteristics of a compound semiconductor field effect transistor, an n-GaAs substrate is used. After forming an n$^-$-GaAs layer and an i-AlGaAs layer successively on the substrate, an n-type transistor is formed on these layers. Subsequently, on the rear side of the n-GaAs substrate, an ohmic electrode is formed, to connect with a drain electrode on a surface side. In the structure, when a drain current is increased, at a drain side electron also flows toward the substrate, so that the current concentration on a drain region is relaxed. Thereby, the drain current voltage characteristics can be improved.

5 Claims, 6 Drawing Sheets

ALONG THE LINE A-A

ALONG THE LINE B-B n-GaAs    i-AlGaAs    n⁻-GaAs    n-GaAs

FIELD EFFECT TRANSISTOR WITH FIRST AND SECOND DRAIN ELECTRODES

BACKGROUND OF THE INVENTION

1. Field of the Invention

The present invention relates to a compound semiconductor field effect transistor with an enhanced drain current-voltage characteristics.

2. Description of the Prior Art

FIG. 1 is a diagrammatic representation showing a conventional field effect transistor of a gallium arsenide schottky barrier type having a typical n-type conductive layer (GaAs MESFET). In the MESFET, on a semiconductor GaAs substrate 15 formed are an undoped buffer layer or i-layer 16 and an n-type conductive layer or n-layer 4, and a part of the n-layer 4 in the vicinity of a gate region is removed by etching to form a recess. Further, in the recess a schottky gate electrode 6 is formed, and on the n-layer 4 outside the recess, an ohmic source electrode 7 and a drain electrode 8 are formed. Also, on a rear side, for example, a layer of Au 10 is formed, and a rear-side electrode is grounded.

In the conventional FET, when a drain voltage is increased, as described in, for example "Light Emission and Burnout Characteristics of GaAs Power MESFET's" of IEEE Transactions on Electron Devices, Vol. ED-25, No.6, Jun. 1978, pp 567–573, a high electric field is generated at end portions of the recess. Also, in the vicinity of the end portions of the recess, a drain current is concentrated. The problem is that destruction is caused by high electric field and high current.

SUMMARY OF THE INVENTION

An object of the present invention is to provide a FET difficult to destroy or deteriorate by inhibiting a drain current from being concentrated on the ends of a recess.

To attain the aforementioned object, according to the invention, a drain electrode is provided also on a rear side of a substrate. Specifically, by letting the drain current flow also from the rear side, the concentration of the current on the recess ends can be controlled.

Since the drain electrode is formed on the rear side, as the substrate an n-type layer is used, and on the substrate, a low-concentration n-layer, a p-layer or an undoped GaAs layer (i-layer) is formed. If necessary, further on the layers, an AlGaAs layer is interposed having a broader band gap than the GaAs layer. On the layers, a MESFET having a usual n-type conductivity is formed. The aforementioned low-concentration n-layer, the p-layer, the i-layer or the AlGaAs layer prevents current from flowing between a source electrode on a surface side and the drain electrode on a rear side.

The movement of an electron in the aforementioned structure when a drain voltage is applied is now described. Under a source region, the electron does not obtain an energy from an electric field, and is positioned in the vicinity of a conductive band. Therefore, a potential barrier formed at a junction part with the i-layer or the p-layer under the n-layer, or a barrier formed by band discontinuity of the AlGaAs layer as shown in FIG. 2A obstructs the flow of electron toward the rear side. However, since under the drain region the electron gains the energy of the electric field, as shown in FIG. 2B, the electron goes beyond the aforementioned potential barrier to reach the drain electrode at the rear side.

According to the aforementioned principle of the movement, the drain current can be controlled by the potential of a gate.

DETAILED DESCRIPTION OF THE PREFERRED EMBODIMENTS

Embodiments of the present invention are now described with reference to the accompanying drawings.

Figure 1:
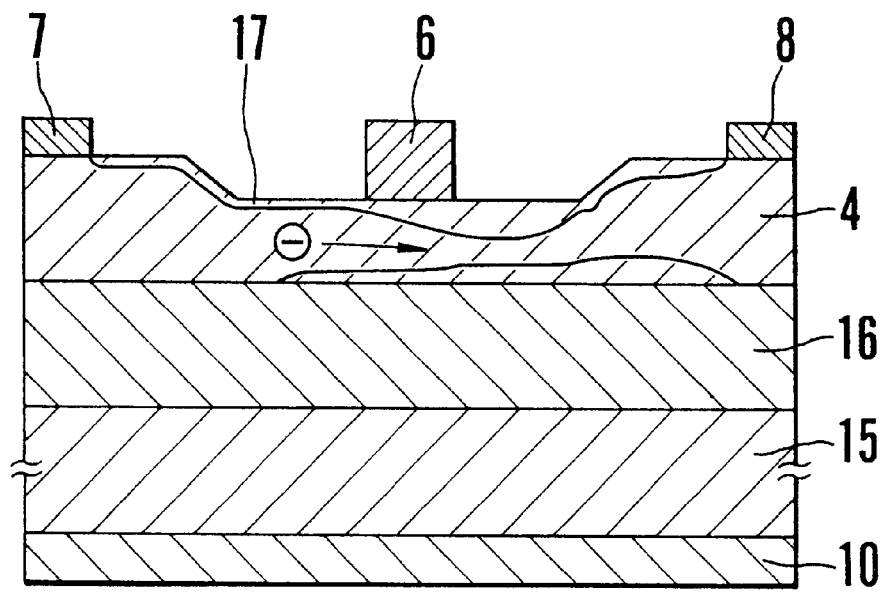
FIG. 1 is a cross-sectional view of a GaAsFET having a conventional structure.
Figure 2A:
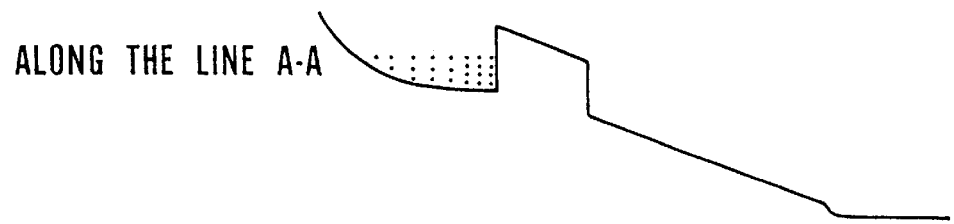
FIG. 2A shows a conductive band between line A—A in FIG. 3.
Figure 2B:
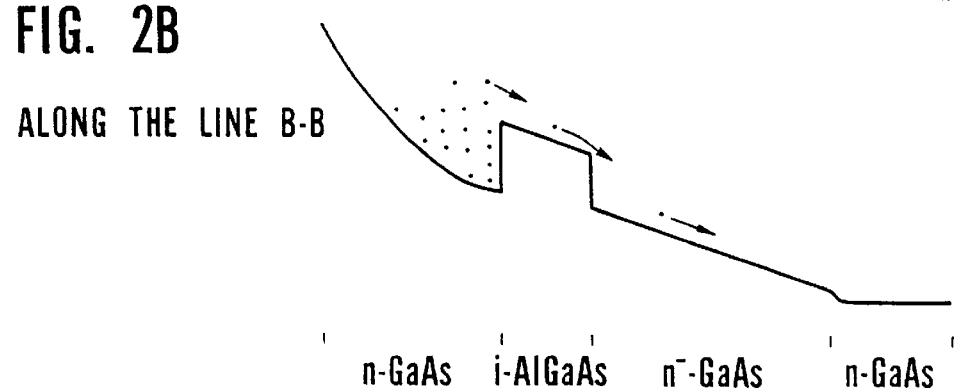
FIG. 2B shows a conductive band between line B—B in FIG. 3.
Figure 3:
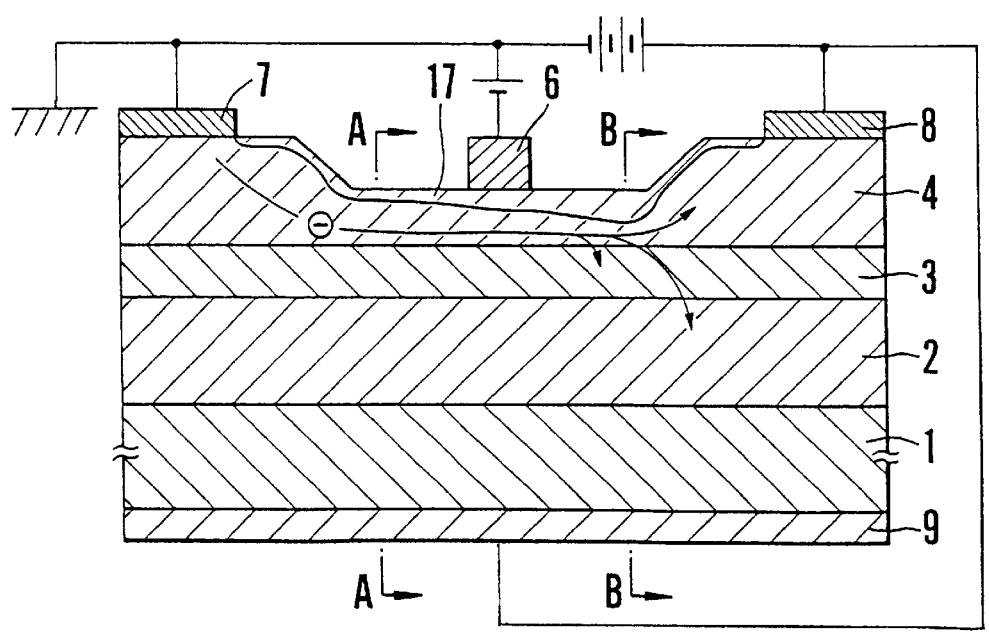
FIG. 3 is a cross-sectional view of a GaAsFET embodying the present invention.

FIG. 3 shows a cross section of GaAsFET of the invention, the manufacture of which will now be described in the following referring to FIGS. 4A, 4B and 4C.

Figure 4A:
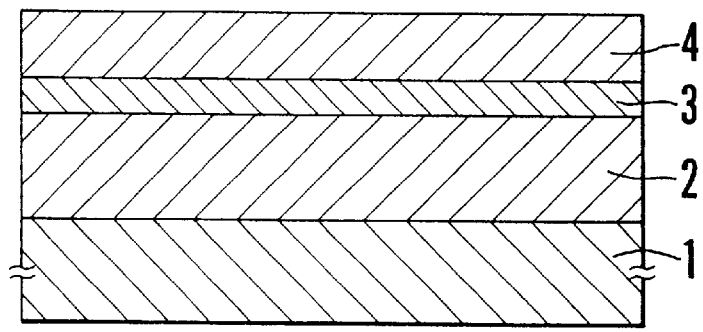
FIGS. 4A, 4B and 4C are cross-sectional views showing a manufacture process of the GaAsFET shown in FIG. 3 embodying the invention.

First, as shown in FIG. 4A, on an n-GaAs substrate 1 with a concentration of $1\times10^{17} cm^{-3}$, for example in a MOCVD method, an $n^-$-GaAs layer 2 with a concentration of $1\times10^{16}$ $cm^{-3}$ is grown to 1 $\mu m$, subsequently, an undoped i-$Al_xGa_{1-x}As$ layer (X=0.25) 3 is grown to 0.2 $\mu m$, and finally an n-GaAs layer 4 with a concentration of $1\times10^{17}$ $cm^{-3}$ is grown to 0.3 $\mu m$.

Figure 4B:
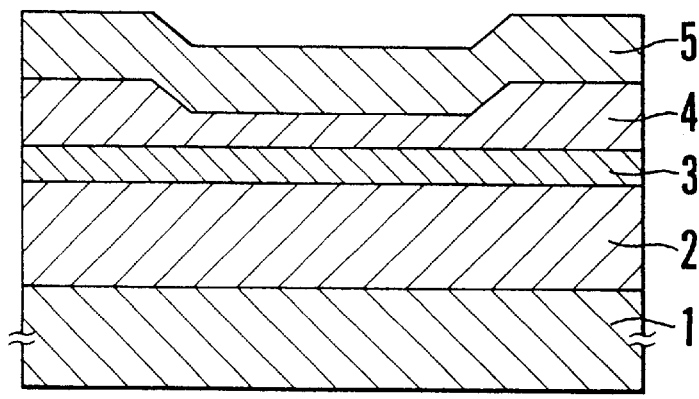

Subsequently, as shown in FIG. 4B, a resist layer is patterned, and the n-GaAs layer 4 in the vicinity of a gate region is etched by 0.15 $\mu m$ using a solution of $H_2SO_4+H_2O_2+H_2O$, to form a structure of recess. Subsequently, a $SiO_2$ film 5 is grown to 0.5 $\mu m$ in a plasma CVD method.

Figure 4C:
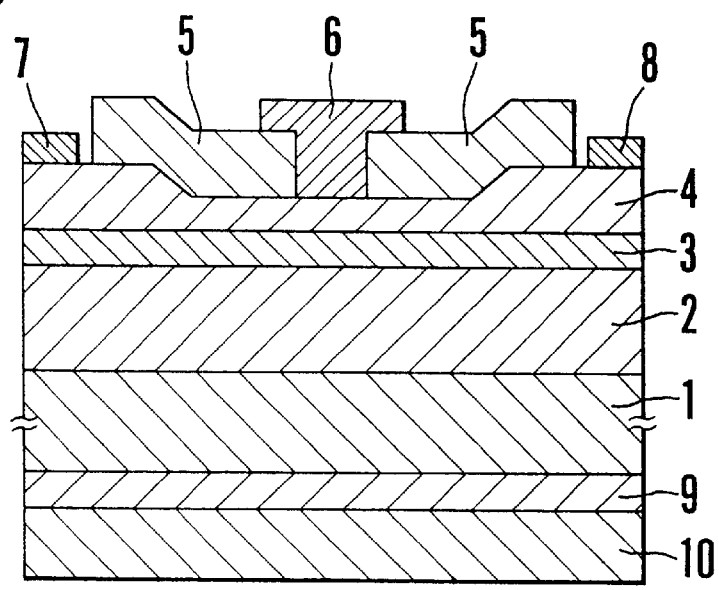

Subsequently, as shown in FIG. 4C, after the $SiO_2$ film 5 in the gate region is removed by dry etching using $CF_4$, 0.1 $\mu m$ of WSi and 0.5 $\mu m$ of Au are evaporated over the entire surface of a wafer in a sputtering method. Unnecessary Au and WSi are removed by an $Ar^+$ milling method with a resist as a mask to form a T-type gate electrode 6 shown in the figure.

Subsequently, with a resist used as a mask (not shown), $SiO_2$ is etched or removed with HF from a region in which source and drain electrodes are to be formed, then 0.15 $\mu m$ of AuGe and 0.04 $\mu m$ of Ni are formed in a vacuum evaporation method. After removing the resist, thermal treatment is made at 400° C. for one minute, causing reaction of AuGe and Ni with GaAs, to form an ohmic source electrode 7 and a drain electrode 8.

Subsequently, on the rear side of the n-GaAs substrate 1, 0.15 μm of AuGe and 0.04 μm of Ni are evaporated a thermal treatment is again made at 400° C. for one minute, thereafter 2 μm of Au layer 10 is formed by plating, finishing the manufacture of the FET.

Figure 5A:
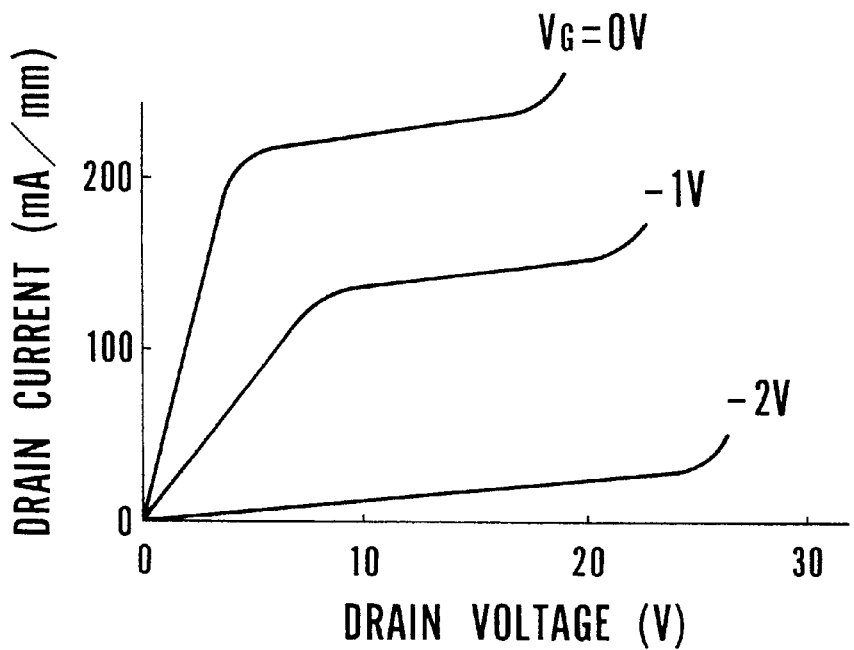
FIG. 5A shows drain current-voltage characteristics of the FET according to the invention.

Measurement results of drain current-voltage characteristics of the FET having the aforementioned structure are shown in FIG. 5A.

Figure 5B:
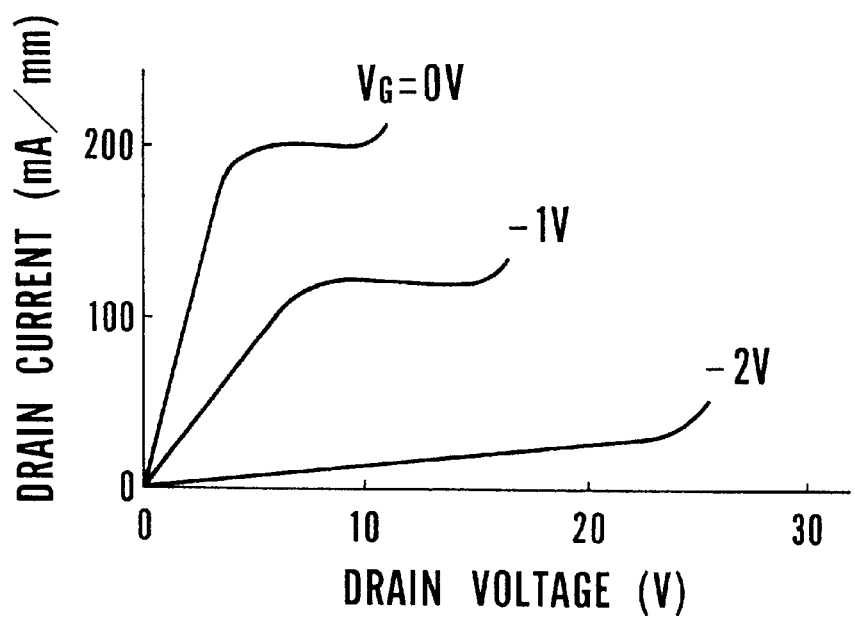
FIG. 5B shows drain current-voltage characteristics of a conventional FET.

In the conventional structure, as shown in FIG. 5B, for example at $V_G$=OV, a drain voltage at which a drain current is rapidly increased, i.e. a drain breakdown voltage characteristics was about 10V, while in the present structure, the breakdown voltage characteristics of nearly 20V was obtained. Especially in the region in which the drain current is large, the breakdown voltage characteristics can be largely enhanced.

Figure 6:
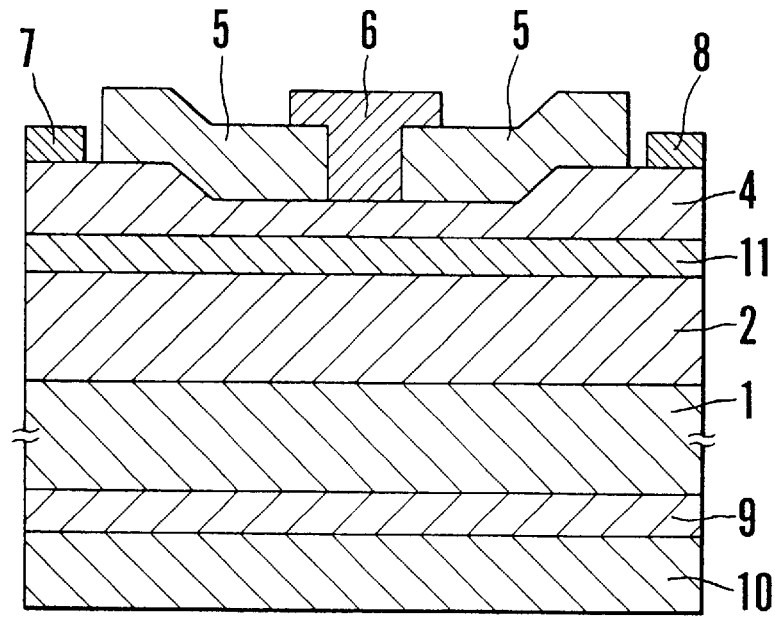
FIG. 6 is a cross-sectional view showing another embodiment of the GaAsFET according to the invention.

FIG. 6 shows another embodiment of the invention, in which, different from the FET of FIG. 3, instead of the i-AlGaAs layer 3, a p-GaAs layer 11 is inserted under the n-GaAs layer 4. The p-GaAs layer 11 is constituted to have a concentration of $1 \times 10^{18}$ cm$^{-3}$ and a thickness of 0.05 μm. According to the embodiment, the enhancement in the breakdown voltage characteristics can be achieved in the same manner as afore-mentioned. The other constitution is the same as in FIG. 3, therefore further description is omitted.

Figure 7:
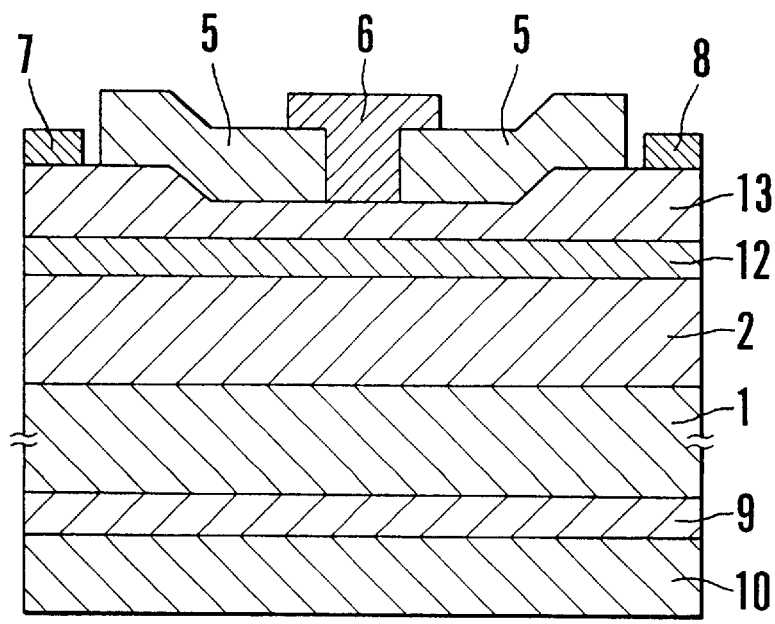
FIG. 7 is a cross-sectional view showing further embodiment of the GaAsFET according to the invention.

FIG. 7 shows further embodiment of the invention. In the FET, different from the embodiment shown in FIG. 3, an i-In$_x$Ga$_{1-x}$As layer 12 having X of nearly 0.2 and a thickness of 0.015 μm, and an n-AlGaAs layer 13 having a concentration of about $2 \times 10^{18}$ cm$^{-3}$ and a thickness of 0.04 μm under the gate are formed. This structure is a so-called HEMT structure. Also in this case, the drain current-voltage characteristics can be improved. Since the other structure is the same as in FIG. 3, further description is omitted.

Figure 8:
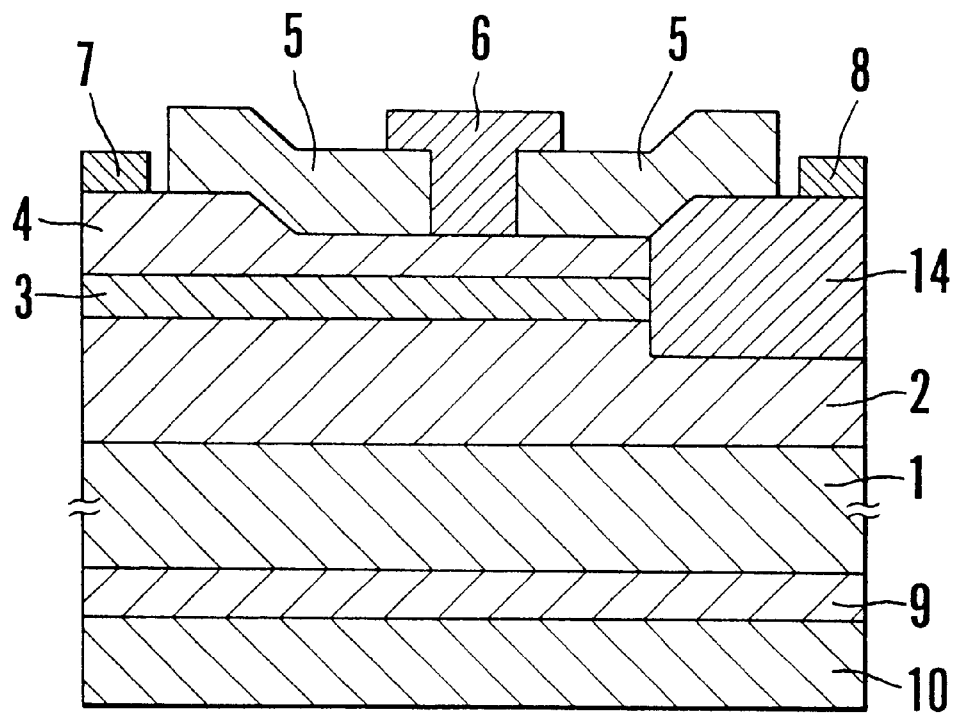
FIG. 8 is a cross-sectional view showing still further embodiment of the GaAsFET according to the invention.

FIG. 8 shows further embodiment of the invention. In addition to the structure according to the embodiment shown in FIG. 3, an n$^+$GaAs layer 14 is formed on a surface drain region. The n$^+$GaAs layer 14 permits electrons to easily flow toward a drain electrode 10 on the rear side, and can relax the concentration of electric field on recess ends. Since the other structure is the same as in FIG. 3, description is omitted.

According to the field effect transistor of the invention, the drain resistant pressure can be enhanced.

This is because by providing the drain electrode also on the rear side of the substrate, the electron supplied from the source electrode also flows toward the substrate, so that current is inhibited from concentrating on the recess ends at the drain side.

What is claimed is:

1. A compound semiconductor field effect transistor comprising:
   an n-type conductive layer;
   a gate electrode on a top side of said n-type conductive layer;
   a source electrode on said top side of said n-type conductive layer positioned on a first side of said gate electrode;
   a first drain electrode on said top side of said n-type conductive layer positioned on a second side of said gate electrode; and
   a second drain electrode provided on an entire surface of a rear side of a compound semi-conductor substrate.

2. A field effect transistor (FET), comprising:
   a semiconductor substrate having a top side and a bottom side, said top side having a center recessed area;
   a gate electrode positioned in said center recessed area;
   a source electrode positioned on one side of said recessed area;
   a first drain electrode positioned on an opposite side of said recessed area; and
   a second drain electrode positioned on an entire surface of said bottom side of said semiconductor substrate, said second drain electrode for inhibiting a drain current from being concentrated on ends of said center recessed area.

3. A field effect transistor (FET) as recited in claim 2, wherein said semiconductor substrate includes a plurality of layers, comprising:
   a first n-type semiconductor layer;
   a low concentration n-type semiconductor layer formed on said first n-type semiconductor layer;
   one of a p-type semiconductor layer and an intrinsic semiconductor layer formed on said low concentration n-type semiconductor layer; and
   a second n-type semiconductor layer formed on said one of a p-type semiconductor layer and an intrinsic semiconductor layer, said center recessed area being formed in said second n-type semiconductor layer,
   wherein said plurality of layers prevents current from flowing between said source electrode on said top side and said second drain electrode on said bottom side.

4. A field effect transistor (FET) as recited in claim 3, wherein said first and said second n-type semiconductor layers comprise n-GaAs, and wherein said intrinsic semiconductor layer has a band gap broader than GaAs.

5. A field effect transistor (FET) as recited in claim 4, wherein said intrinsic semiconductor layer comprises Al$_x$Ga$_{1-x}$As.

* * * * *